United States Patent [19]

Ishikawa et al.

[11] Patent Number: 5,119,034
[45] Date of Patent: Jun. 2, 1992

[54] METHOD OF MEASURING DIELECTRIC MATERIAL CONSTANTS AND MEASURING DEVICE EMPLOYED THEREFOR

[75] Inventors: Youhei Ishikawa; Hidekazu Wada; Jun Hattori; Hiroyuki Kubo; Taiyo Nishiyama, all of Nagaokakyo, Japan

[73] Assignee: Murata Manufacturing Co., Ltd., Japan

[21] Appl. No.: 550,161

[22] Filed: Jul. 9, 1990

[30] Foreign Application Priority Data

| Jul. 12, 1989 | [JP] | Japan | 1-81997[U] |
| Jul. 12, 1989 | [JP] | Japan | 1-180075 |
| Jul. 24, 1989 | [JP] | Japan | 1-87051[U] |
| Jul. 24, 1989 | [JP] | Japan | 1-192069 |
| Aug. 10, 1989 | [JP] | Japan | 1-94440[U] |
| Aug. 17, 1989 | [JP] | Japan | 1-212757 |
| Aug. 29, 1989 | [JP] | Japan | 1-222255 |

[51] Int. Cl.⁵ ............................. G01R 27/04
[52] U.S. Cl. .............................. 324/633; 324/632; 324/636; 324/703; 219/10.55 A; 374/122
[58] Field of Search .......... 219/10.55 A, 10.55 B; 374/122, 121, 149; 333/232; 324/632, 636, 633, 703

[56] References Cited

U.S. PATENT DOCUMENTS 3,927,369 12/1975 Billeter .......................... 374/122
4,870,235 9/1989 Steers ........................... 219/10.55 B
4,899,100 2/1990 Talanker ........................ 324/636

FOREIGN PATENT DOCUMENTS 62-211566 9/1987 Japan .

Primary Examiner—Kenneth A. Wieder
Assistant Examiner—Jose M. Solis
Attorney, Agent, or Firm—Ostrolenk, Faber, Gerb & Soffen

[57] ABSTRACT

A method of measuring dielectric material constants, which includes steps of forming a dielectric resonator by providing a plurality of coupling terminals for input and output of signals, on a shield case, with a dielectric sample being disposed within the shield case, constituting an oscillation circuit together with the dielectric resonator by connecting a positive feed-back circuit including an amplification circuit, between the signal output coupling means and the signal output coupling means, and measuring variation in an oscillation frequency of the oscillation circuit by heating the dielectric sample through injection of a high frequency power into the particular coupling terminal, so as to obtain a specific material constant of the dielectric sample based on the variation of the oscillation frequency, and, also a measuring device employed for effecting the measuring method.

8 Claims, 12 Drawing Sheets

METHOD OF MEASURING DIELECTRIC MATERIAL CONSTANTS AND MEASURING DEVICE EMPLOYED THEREFOR

BACKGROUND OF THE INVENTION

The present invention generally relates to a method of measuring a dielectric material constant and a measuring device for effecting said measuring method, and more particularly, to a method of measuring temperature characteristics of a dielectric sample and a device employed for carrying out said method.

Conventionally, in the technical field referred to above, there has been known a practice in which, with a dielectric sample being disposed within a shield case, a resonance frequency for $TE_{01n}$ (generally n=1) or $TE_{01\delta}$ mode is measured, and then, the shield case is placed in a constant temperature bath for heating to bring it close to a thermal equilibrium state, and thereafter, the resonance frequency is again measured for finding the temperature characteristic of the dielectric sample.

However, by the known practice employing the constant temperature bath as described above, not only is the size of the apparatus undesirably increased, but also, a long time is required before the dielectric sample is heated up to a predetermined temperature to reach a state of equilibrium.

Accordingly, there has been conventionally proposed in Japanese Patent Laid-Open Publication Tokkaisho No. 62-211566, assigned to the same assignee as the present invention, a method of measuring a dielectric material constant and a measuring device employed for that method, in which the conventional problems as referred to above have been eliminated by directly subjecting the dielectric sample to high frequency heating.

In FIG. 14, there is schematically shown the known dielectric material constant measuring device M referred to above, which generally includes a cylindrical shield case S having a bottom wall, with a hollow cylindrical dielectric sample D being fixed approximately at a central portion in the interior of said shield case S by a support rod P, thereby constituting a dielectric resonator R. On the side wall of the shield case S, an input connector I and an output connector O are mounted in opposed positions, each of which connectors is provided with a coupling means such as a coupling loop or the like, while a network analyser W is connected between said input and output connectors I and O. Moreover, another connector Cn also provided with a coupling means such as a coupling loop or the like is further mounted on the side wall of the shield case S, with a high frequency injection device H for heating being connected to said connector Cn.

In the known measuring device as described above, the high frequency injection device H for the heating purpose pours high frequency power into the dielectric resonator R, whereby the dielectric sample D is subjected to high frequency heating. On the other hand, the network analyser W measures the resonance frequency, etc. of the dielectric resonator R coupled between the input and output connectors I and O.

As described above, by measuring the resonance frequency when the dielectric sample D is at the predetermined temperature, the temperature characteristics of the dielectric sample D may be found.

However, in the measuring method of the dielectric material constant and the measuring device employed therefor, based on high frequency heating as referred to above, the problem has been that the measuring device becomes expensive and large in size on the whole, since the very expensive network analyser is employed for measuring the resonance frequency of the dielectric resonator.

SUMMARY OF THE INVENTION

Accordingly, a first object of the present invention is to provide a dielectric material constant measuring method and a measuring device employed therefor, which are so arranged that the resonance frequency of the dielectric resonator may be measured without employing the expensive, generally-used network analyser, in order to substantially eliminate the disadvantages inherent in the conventional methods and devices of this kind.

A second object of the present invention is to provide a dielectric material constant measuring device of the above described type, in which a heating system for high frequency heating of the dielectric sample is arranged not to interfere with a measuring the system for measuring resonance frequency of the dielectric resonator.

A third object of the present invention is to provide a dielectric resonator for use in a dielectric material constant measuring device of the above described type, in which an external Q value of a coupling member may be readily adjusted based on a result of detection of a matched state between the coupling member and the dielectric resonator.

A fourth object of the present invention is to provide a dielectric resonator of the above described type, in which heat dissipation therefrom is reduced, and a state of junction or connection of a lid member with respect to the shield case is stabilized for the dielectric material constant measuring dielectric resonator and dielectric resonators in general.

A fifth object of the present invention is to provide a dielectric resonator and a method of measuring temperatures of a dielectric sample, which are so arranged that, when the material constant of a dielectric sample is to be measured, temperatures of the dielectric sample can be measured from outside the shield case through noncontact means.

A sixth object of the present invention is to provide a dielectric resonator which may be positioned with high accuracy without effecting any particular positioning work when a cylindrical dielectric unit is to be disposed at a predetermined position within a cavity or on a printed circuit board, etc. by a support base.

A seventh object of the present invention is to provide a temperature characteristics measuring device for a dielectric material, in which the dielectric material to be measured for temperature characteristics is efficiently heated, and a stable temperature condition can be realized, while temperature characteristics of a dielectric material may be measured with high accuracy in a short period of time.

In accomplishing these and other objects, according to a first aspect of the present invention, there is provided a method of measuring dielectric material constants, which includes steps of forming a dielectric resonator by providing a plurality of coupling means for input and output of signals, on a shield case, with a dielectric sample being disposed within said shield case, constituting an oscillation circuit together with said dielectric resonator by connecting a positive feed-back circuit including an amplification circuit, between the signal input coupling means and the signal output coupling means, and measuring variation in an oscillation frequency of said oscillation circuit by heating said dielectric sample through injection of a high frequency power into the particular coupling means, thereby to obtain a specific material constant of said dielectric sample based on the variation of the oscillation frequency.

There is also provided a measuring device for dielectric material constants, which includes a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, a frequency measuring means for measuring an oscillation frequency of said oscillation circuit, and a high frequency power injecting means for heating said dielectric sample by injecting a high frequency power into the particular coupling means, whereby a specific material constant of the dielectric sample is obtained by the oscillation frequencies before and after heating of said dielectric sample.

In the above dielectric material constant measuring method and the measuring device employed therefor according to the present invention, the dielectric resonator is first constituted by providing the plurality of coupling means for input and output of signals, on the shield case, with the dielectric sample being disposed within said shield case, and the oscillation circuit is constituted together with the dielectric resonator by connecting the positive feed-back circuit including the amplification circuit, between the signal input coupling means and the signal output coupling means.

For the coupling means of the above signal input and output, means for coupling with a predetermined mode is selected, while the positive feed-back circuit is also so selected that the loop length becomes an integer multiple of the wavelength at the oscillation frequency. Accordingly, by the above positive feed-back circuit, the dielectric resonator resonates at the predetermined mode. The frequency measuring means measures the oscillation frequency of said oscillation circuit, i.e. resonance frequency of the dielectric resonator. Meanwhile, the high frequency injecting means pours the high frequency power into the predetermined coupling means, whereby the high frequency electro-magnetic field is applied to the dielectric sample for heating thereof based on the principle of induction heating. As described above, specific material constants such as temperature coefficient, etc. of the resonance frequency of the dielectric sample may be obtained from the variation of the oscillation frequency of the oscillation circuit before and after heating of the dielectric sample, i.e. variation of the resonance frequency of the dielectric resonator.

In the second aspect of the present invention, there is provided a measuring device for dielectric material constants, which includes a dielectric resonator including a shield case provided with a plurality of coupling means for signal input and output, with a dielectric sample disposed within said shield case, a resonance frequency measuring means connected between a signal input coupling means and a signal output coupling means for measuring the resonance frequency of said dielectric resonator, and a high frequency power injecting means for heating said dielectric sample in a mode in which electromagnetic field strength becomes approximately the lowest at positions of said signal input coupling means, and signal output coupling means by injecting high frequency power into the particular coupling means, whereby the specific material constant of the dielectric sample is obtained from resonance frequencies at different temperatures of said dielectric sample.

In the above arrangement of the present invention, for example, the signal input coupling means and the signal output coupling means are provided at approximately the same height as that of the central portion of the dielectric sample, while the dielectric resonator is caused to resonate by subjecting the signal of the signal output coupling means to positive feed-back to the signal input coupling means. On the other hand, the coupling means for the high frequency power injection is provided at a height different from the height at the central portion of the dielectric sample, and the high frequency heating is effected in $TE_{011-\delta}$ mode by the high frequency power injecting means. This mode provides a node of the electromagnetic field distribution at the position of the height at the central portion of the dielectric sample, and the electromagnetic field strength becomes approximately the lowest at that position. Accordingly, energy of the heating high frequency power is not coupled with the signal input coupling means and the signal output coupling means, and therefore, the frequency measuring system is not affected. Owing to this arrangement, measuring accuracy of the resonance frequency is improved, and no abnormal high level signals are supplied to the circuit of the measuring system.

In the third aspect of the present invention, there is provided a dielectric resonator which includes a case having wall means to define a cavity therein, a dielectric unit provided in the cavity, and a coupling member extending into said cavity through said wall means. The dielectric resonator further includes a coupling member guiding means for movably guiding said coupling member in internal and external directions with respect to said cavity, and an actuator for displacing the coupling member along said guiding means, whereby an external value Q is adapted to be adjustable by the degree of projection of said coupling member into said cavity.

In the above arrangement according to the present invention, the amount of protrusion of the coupling member into the cavity is altered by the displacement of the coupling member. For example, in the case where the coupling member is constituted by a coupling loop, the area affected by the coupling loop, i.e. magnetic lines of force interlinkage area of the coupling loop is varied, with consequent alteration in the external value Q (Qe). More specifically, Qe is decreased as the area of the coupling loop increases, while Qe is increased as the area is decreased. Since the degree of protrusion of the coupling member into the interior of the cavity can be adjusted, even when the non-load value Q (Qo) of the dielectric member is altered, the coupling member and the dielectric resonator are held in the matched state at all times if the actuator is controlled to make the external value Q (Qe) of the coupling member equal to Qo according to the above alteration of Qo.

In the fourth aspect of the present invention, the dielectric resonator includes a shield case for accommodating a dielectric unit therein, and a lid member for tightly closing an opening of the shield case. The shield case and lid member define a cavity therein, which is evacuated for a vacuum state so as to subject the lid member to vacuum attraction with respect to the shield case.

In the above construction, since the interior of the cavity is held in the vacuum state, the heat of the dielectric unit (dielectric sample) is insulated by the vacuum, with a less heat conduction to the cavity by air convection, and thus, the dielectric sample is heated very efficiently and temperature stability is also improved.

Moreover, owing to the arrangement that the lid member is attracted with respect to the shield case through vacuum attraction, not only the conventional screw setting is dispensed with, but since the lid member is depressed onto the shield case by the atmospheric pressure, both are joined to each other by a stable depressing force. Accordingly, each time the lid member is opened or closed or, when each dielectric resonator is to be assembled, the dielectric resonator is constituted by a favorable reproducibility.

Further, in the fifth aspect of the present invention, the dielectric resonator includes a shield case in which a dielectric sample is disposed, and a input and output coupling means for signals, provided on said shield case. The shield case is formed, in its one part, with a window portion for transmission or passing of infrared rays radiated from said dielectric sample therethrough.

In the fifth aspect of the present invention, there is also provided a temperature measuring method of a dielectric material which includes the steps of subjecting a dielectric material placed in a shield case to high frequency heating, and measuring material constant of the dielectric material thus heated, with the shield case being formed, at its one part, with a window portion to allow infrared rays to transmit or pass therethrough. The dielectric material is measured for its temperature through the window portion by an infrared radiation thermometer.

By the above arrangement according to the present invention, part of the infrared rays irradiated from the dielectric sample is discharged out of the shield case through said window, thus making it possible to measure the temperature of the dielectric sample through non-contact.

As described above, by constituting the dielectric resonator, and measuring the temperature of the dielectric sample from outside the shield case by the infrared ray radiation thermometer, it becomes unnecessary to provide a metallic member other than the coupling means within the dielectric resonator, and thus, the temperature of the dielectric sample may be measured through non-contact during functioning by the predetermined resonance mode, without disturbing electromagnetic field distribution of the dielectric resonator.

In the sixth aspect of the present invention, there is further provided a dielectric resonator which includes a resonator cavity defined by a shield case and a lid member for the shield case, a support base fixed at a predetermined position in said shield case, and a cylindrical dielectric unit disposed on said support base. The support base is formed, at its upper face, with a protrusion which is fitted into an opening in a bottom face of said cylindrical dielectric unit.

In the above structure, since the support base is preliminarily fixed at the predetermined position within the cavity or on a circuit board, positioning of the dielectric unit may be completed by merely placing the dielectric unit on said support base. Accordingly, it is not necessary to provide a positioning mechanism or the like externally.

Further, in the seventh aspect of the present invention, there is provided a temperature characteristics measuring device for a dielectric resonator, which includes a conductor cavity case, a support means provided within said conductor cavity case to support thereon a dielectric sample to be measured for the temperature characteristics, thereby to measure the temperature characteristics of said dielectric sample through raising its temperature by injecting a high frequency wave into said dielectric sample from a high frequency injecting device for heating. The support means is provided with a plurality of support rods extending upwardly therefrom, so as to support said dielectric sample at forward ends of the respective support rods.

In the above arrangement, when the dielectric sample is raised in its temperature as the high frequency wave is injected thereinto by the heating high frequency injecting device, the heat is conducted through the support rod of said dielectric sample, into the conductor cavity case. However, since said support rod is formed to be small in the diameter on the whole, with a small thermal capacity, heat conduction via said support rod tends to be obstructed, and thus, such heat conduction from the dielectric sample to the conductor cavity case suppressed, thereby rapidly raising the temperature of said dielectric sample. By the above construction, since leakage of heat from the dielectric resonator is suppressed, only the temperature of the dielectric sample heated by the high frequency wave is rapidly raised, thus making it possible to efficiently measure the temperature characteristics of the dielectric material at high accuracy.

BRIEF DESCRIPTION OF THE DRAWINGS

These and other objects and features of the present invention will become apparent from the following description of several preferred embodiments thereof with reference to the accompanying drawings, in which.

DETAILED DESCRIPTION OF EMBODIMENTS OF THE INVENTION

Figure 1:
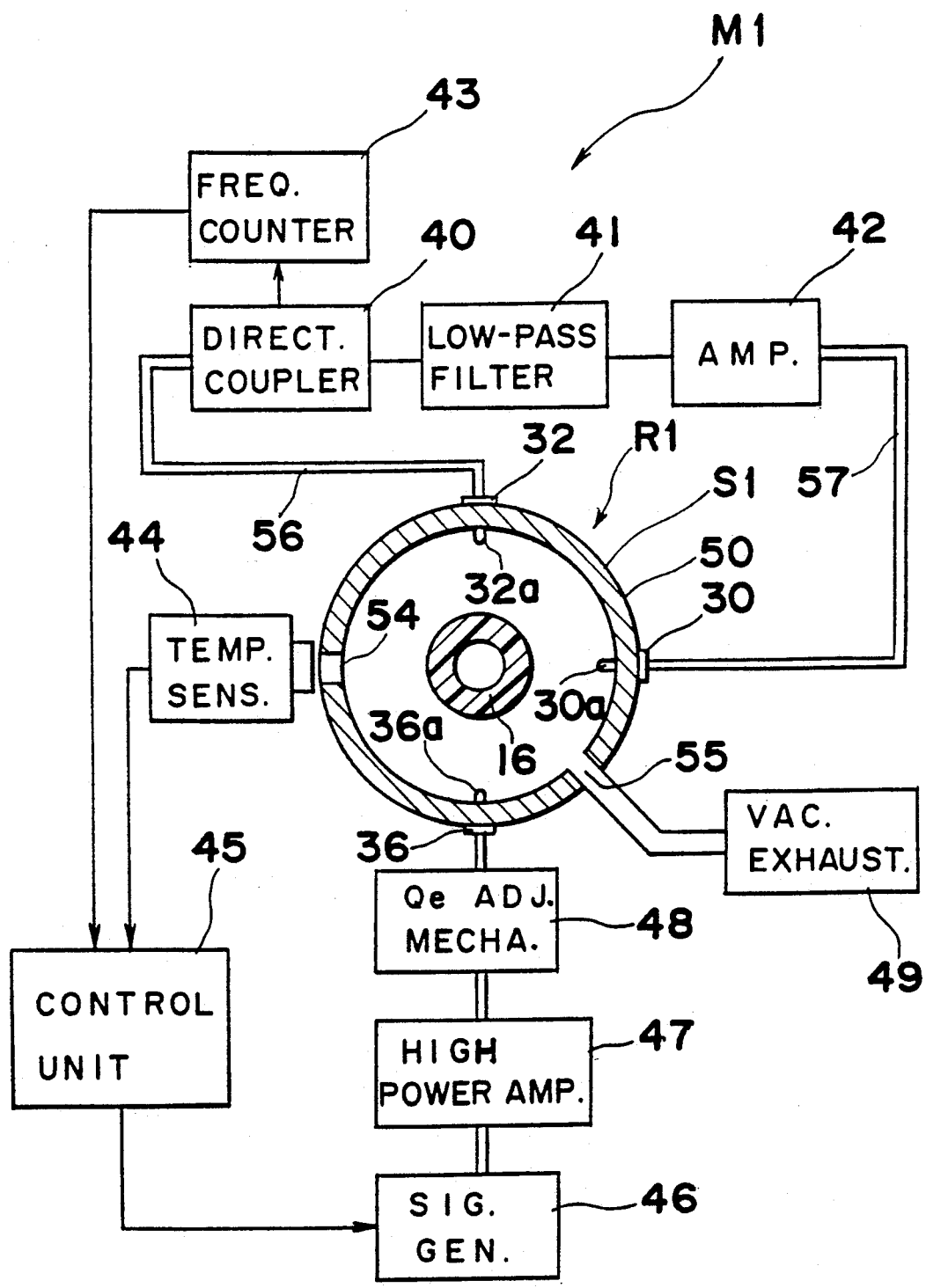
FIG. 1 is a schematic block diagram showing general construction of a dielectric material constant measuring device M1 according to a first embodiment of the present invention.

Before the description of the present invention proceeds, it is to be noted that like parts are designated by like reference numerals throughout the accompanying drawings.

Figure 2A:
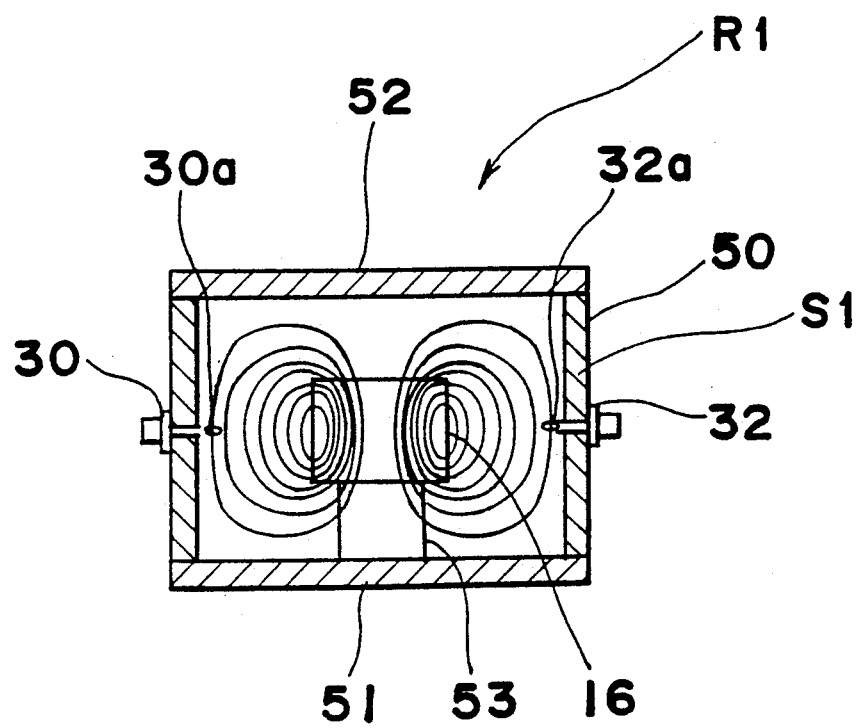
FIGS. 2(A) and 2(B) are schematic vertical cross sections of a dielectric resonator R1 employed in the measuring device M1 of FIG. 1, with FIG. 2(A) showing a mode in a frequency measuring system, and FIG. 2(B) representing another mode in a heating system.

Referring now to the drawings, there is shown in FIG. 1, a measuring device M1 for measuring dielectric material constants according to a first embodiment of the present invention, which includes a dielectric resonator R1 having a shield case S1 which is made of an electrically conductive material such as aluminum, its alloy or the like, and constituted by a cylindrical side wall 50, a bottom wall 51 (FIG. 2(A)) attached to or integrally formed with the side wall 50, and a lid member 52 applied onto the upper portion of said side wall (FIG. 2(A)). It is to be noted here that the shield case S1 may be modified to be constituted by a dielectric material such as a ceramic material formed with a shield electrode thereon.

Figure 2B:
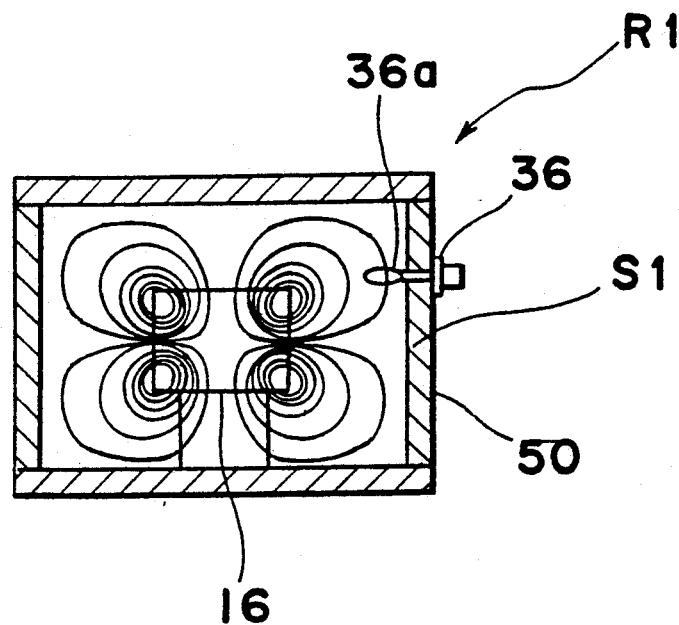

As shown in FIGS. 2(A) and 2(B), within the shield case S1 for the dielectric resonator R1, a hollow cylindrical dielectric sample 16 is mounted on a cylindrical support base 53 (FIG. 2(A)) made of a dielectric material having a low dielectric constant such as forsterite or the like, and thus fixedly disposed generally at a central portion in said shield case S1. As illustrated in FIG. 2(A), on the side wall 50 constituting part of the shield case S1, there are provided connectors 30 and 32 in opposed two positions at a height equal to the height at the central portion of the dielectric sample 16. These connectors 30 and 32 are each provided with coupling loops 30a and 32a between respective central conductors and grounding.

Moreover, as shown in FIGS. 1 and 2(B), in a position other than the positions for the connectors 30 and 32 on the side wall 50, another connector 36 is provided at a height different from the height at the central portion of the dielectric sample 16. The connector 36 is also provided with a coupling loop 36a between a central conductor and the grounding thereof. In other positions on the side wall 50, there are further formed a temperature measuring window 54 for measuring temperatures of the dielectric sample 16, and also, an exhaust port 55 for vacuum exhaust, to which a vacuum exhaust device 49 is connected. The vacuum exhaust device 49 is intended to evacuate the interior of the shield case S1 for preventing discharge of heat towards outside by convection of air and heat conduction, and also, to cause the lid member 52 to be attracted by vacuum, onto the shield case main portion constituted by the side wall 50 and the bottom wall 51.

For constituting the measuring device M1, various circuit devices are connected to the dielectric resonator R1 as described hereinafter.

Between the connectors 30 and 32, a directivity coupler 40, a low-pass filter 41 and an amplifier 42 are connected through coaxial cables 56 and 57, while a signal generator 46, a high power amplifier 47 and a Qe adjusting mechanism 48 are sequentially coupled with the connector 36, with a temperature sensor 44 coupled with a control unit 45 being disposed to confront the temperature measuring window 54. The directivity coupler 40 is coupled, through a frequency counter 43, to the control unit 45 which is further connected to the signal generator 46 as illustrated.

More specifically, the directivity couple 40 is arranged to distribute the signal from the connector 32 and the coaxial cable 56 respectively into the frequency counter 43 and the low-pass filter 41. The low-pass filter 41 functions to filter the frequency oscillated by the dielectric resonator R1 in $TH_{01\delta}$ mode, and to cut off frequency components oscillating in other higher modes. Meanwhile, the amplifier 42 amplifies the output signal of the low-pass filter 41, and applies the signal to he dielectric resonator R1 through the coaxial cable 57, coaxial connector 30 and coupling loop 30a. The above coaxial cable 56, directivity coupler 40, low-pass filter 41, amplifier 42 and coaxial cable 57 are adapted to function as a positive feed-back circuit with respect to the dielectric resonator R1. In other words, the line length is so set that the phase difference by said positive feed-back circuit becomes an integer multiple of the wavelength in the resonance frequency in the $TH_{01\delta}$ mode. Accordingly, the oscillation circuit constituted by the dielectric resonator R1 and the positive feedback circuit is caused to oscillate at the resonance frequency of the dielectric resonator R1. The frequency counter 43 measures the oscillation frequency of said oscillation circuit.

The temperature sensor 44 is constituted, for example, by a radiation thermometer, and arranged to measure the radiation heat of the dielectric sample 16 through the window portion 54 of the dielectric resonator R1. The signal generator 46 generates a specific frequency signal imparted from the control unit 45, and the high power amplifier 47 subjects said signal to power amplification. The Qe adjusting mechanism 48 adjusts the external value Q (Qe) of the coupling loop 36a, and also, injects the output of the high power amplifier 47 into the dielectric resonator R1 through the connector 36. In this case, since the coupling loop 36a is provided at the position slightly deviated from the height at the central portion of the dielectric sample as shown in FIG. 2(B), it is coupled with the electromagnetic field in $TH_{011+\delta}$ mode, whereby the dielectric sample 16 generates heat. As shown in FIG. 2(B), since the electromagnetic field density is almost 0 at the height of the central portion of the dielectric sample in $TH_{011+\delta}$ mode, it is not combined with the signal input and output coupling loops 30a and 32a for the frequency measuring system as shown in FIG. 2(A), and thus, said oscillation circuit is not affected thereby.

The control unit 45 shown in the measuring device M1 of FIG. 1, is constituted by a personal computer or the like, and arranged to read the results of measurements by the frequency counter 43 and temperature sensor 44, so as to control the signal generator 46.

Incidentally the non-load value Q (Qo) of tee dielectric resonator R1 including the dielectric sample 16 is given by a following equation.

$$1/Q_o = (1/Q_{d1}) + (1/Q_{d2}) + (1/Q_c)$$

where $Q_{d1}$ represents Q related to dielectric loss of the dielectric sample 16, $Q_{d2}$ denotes Q related to dielectric loss of the support base 53, and $Q_c$ shows Q related to joule loss of the shield case S1.

When the high frequency power is to be poured with respect to the dielectric resonator R1 as described above, if the external value Q (Qe) of the coupling loop 36a is approximated or agreed to the non-load value Q (Qo) of the dielectric resonator R1, most of the injected high frequency power is absorbed by said dielectric resonator R1. In this case, reflection from the dielectric resonator R1 (coupling loop) is rendered to be the minimum through agreement of the frequency of the signal outputted by the signal generator 46, with the resonance frequency of the dielectric resonator R1, whereby the dielectric sample 16 is heated at the rate of $Q_o/Q_{d1}$ in the high frequency power injected into the dielectric resonator, with a consequent rise in temperature of the dielectric sample 16.

Generally, the temperature coefficient $\tau_f$ of the frequency for the dielectric sample is given by an equation as follows.

$$\tau_f = (1/f1)(f2 - f1)/(T2 - T1)$$

where T1 represents the temperature before heating, T2 denotes the temperature after heating, f1 shows resonance frequency at the temperature T1, and f2 indicates the resonance frequency at the temperature T2.

In other words, by measuring the resonance frequencies of the dielectric resonator with respect to the temperatures at two points, the temperature coefficient of the frequency for the dielectric sample can be obtained. More specifically, the control unit 45 measures the temperature T1 of the dielectric sample 16 before the heating by the temperature sensor 44, and also, reads the resonance frequency f1 at that time by the frequency counter 43, and thereafter, produces a control signal to the signal generator 46 for generation of the signal having the frequency equal to the resonance frequency of $TH_{011+\delta}$ mode, whereby the dielectric sample 16 is subjected to the high frequency heating. Based on the measured value of the temperature sensor 44, the measured value f2 of the frequency counter 43 is read when the temperature of the dielectric sample has reached the predetermined temperature T2 to establish the state of equilibrium.

It is to be noted here that, in the strict sense, since the resonance frequency of the dielectric resonator is varied as the temperature of the dielectric sample 16 rises, the control unit 45 reads the measured result of the frequency counter 43 even during the heating of the dielectric sample 16, thereby to control the signal generator 46 so as to inject the high frequency power at the frequency equal to the resonance frequency of $TH_{011+\delta}$ mode.

It is also to be noted here that, in the foregoing embodiment, although the temperature coefficient for the frequency of the dielectric sample 16 is measured, since a certain relational equation may be established between the temperature coefficient of the dielectric constant of the dielectric sample and the coefficient of linear expansion of the dielectric sample, the temperature coefficient of the dielectric constant of the dielectric sample can also be obtained from the temperature coefficient of the frequency, for example, by preliminarily measuring the coefficient of linear expansion of the dielectric sample through employment of other measuring means.

By the measuring device M1 according to the embodiment of FIG. 1 as described so far, owing to the arrangement that the oscillation circuit is constituted by connecting the positive feed-back circuit with respect to the dielectric resonator having the dielectric sample disposed within the shield case, it becomes possible to measure the resonance frequency of the dielectric resonator by measuring the oscillation frequency of said oscillation circuit. Therefore, the expensive network analyser conventionally employed may be dispensed with, and thus, the measuring device can be constituted to be compact in size at low cost.

Figure 3:
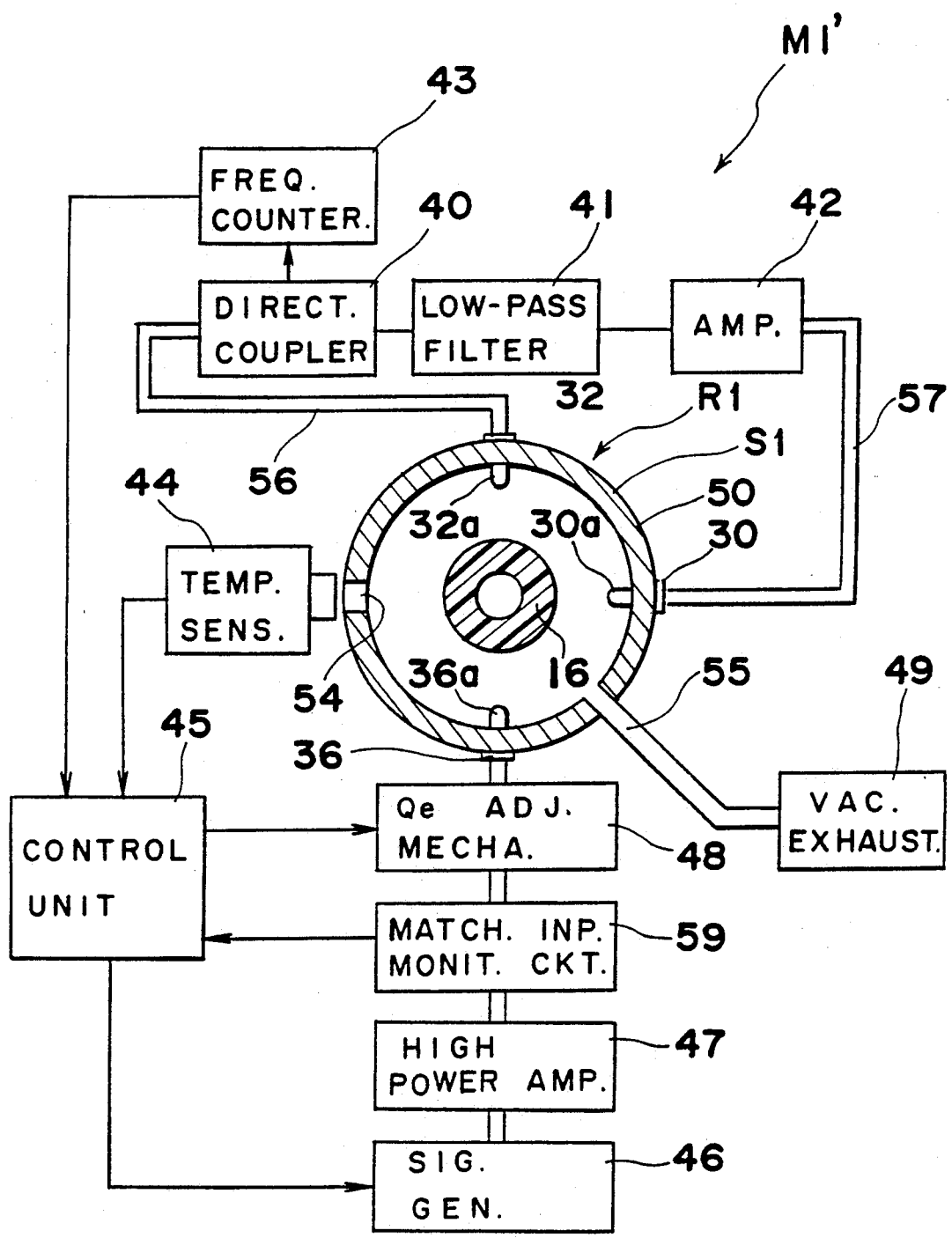
FIG. 3 is a block diagram similar to FIG. 1, which particularly shows a modified dielectric material constant measuring device M1'.

Referring further to FIG. 3, there is shown a modification of the dielectric material constant measuring device M1 of FIG. 1. As compared with the arrangement of FIG. 1, in the modified measuring device M1' in FIG. 3, a matching input monitor circuit 59 is further inserted between the high power amplifier 47 and the Qe adjusting mechanism 48 connected to the connector 36, while the other construction is generally similar to that of the measuring device M1 of FIG. 1.

In the measuring device M1' of FIG. 3, the signal generator 46 generates, based on the control signal as applied from the control unit 45, the signal equal to the resonant frequency of $TH_{011+\delta}$ mode of the dielectric resonator R1, and the high power amplifier 47 subjects said signal to power amplification. The matching input monitor circuit 59 further provided in this modification is intended to watch the state of matching of the high frequency power input with respect to the dielectric resonator R1 from the connector 36. The Qe adjusting mechanism 48 adjusts the external value Q (Qe) of the coupling loop 36a, and also, injects the output of the high power amplifier 47 into the dielectric resonator R1 through the connector 36. In this case, since the coupling loop 36a is provided at the position slightly deviated from the height at the central portion of the dielectric sample as shown as stated earlier, the electromagnetic field distribution in $TH_{011+\delta}$ mode is produced, whereby the dielectric sample 16 generates heat. As shown in FIG. 2(B), since the electromagnetic field density is almost 0 at the height of the central portion of the dielectric sample in $TH_{011+\delta}$ mode, it is not combined with the signal input and output coupling loops 30a and 32a for the frequency measuring system as shown in FIG. 2(A), and thus, said oscillation circuit is not affected thereby as described earlier.

The control unit 45 is also constituted by a personal computer or the like, and arranged to read the results of measurements by the frequency counter 43 and temperature sensor 44, so as to control the signal generator 46 and the Qe adjusting mechanism 48.

More specifically, in the first place, the resonance frequency of $TH_{011+\delta}$ mode is obtained from the resonance frequency of $TH_{01\delta}$ mode of the dielectric resonator by a calculating equation (which is prepared by preliminarily forming experimental values into the formula), and the control signal is applied to the signal generator 46 so as to generate a signal equal to the resonance frequency of $TH_{011+\delta}$ mode thus obtained. Thereafter, based on the result of monitoring by the matching input monitoring circuit, the frequency of the signal generated by the signal generating circuit 46 is brought close to the actual resonance frequency of $TH_{011+\delta}$ mode, and also, the Qe adjusting mechanism is controlled to bring the external value $Q^-(Qe)$ close to the non-load Q value (Qo) of the dielectric resonator, thereby to maintain the matched state.

According to the modified measuring device M1' of FIG. 3, in the state where the high frequency power injecting means is pouring the heating high frequency power with respect to the dielectric resonator including the dielectric sample disposed in the shield case, the energy is hardly combined with the signal input coupling means and the signal output coupling means, and the measuring system for measuring the resonance frequency is not affected by the heating system for heating the sample, and thus, it becomes possible to measure the resonance frequency of the dielectric resonator at high accuracy. Moreover, since the high frequency power for heating is turned into the resonance frequency measuring means, there is no possibility that the resonance frequency measuring means is broken by an abnormally high level signal.

Figure 4:
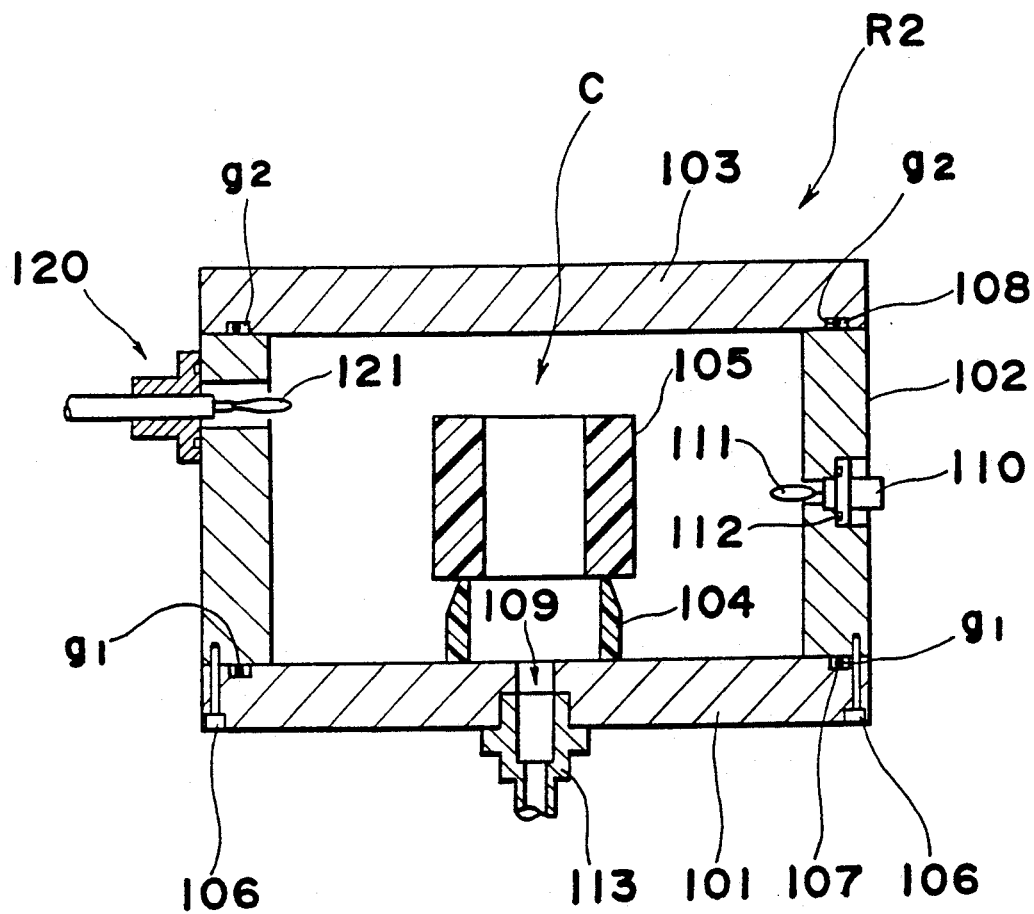
FIG. 4 is a vertical side sectional view of a dielectric resonator R2 according to one preferred embodiment of the present invention.
Figure 5:
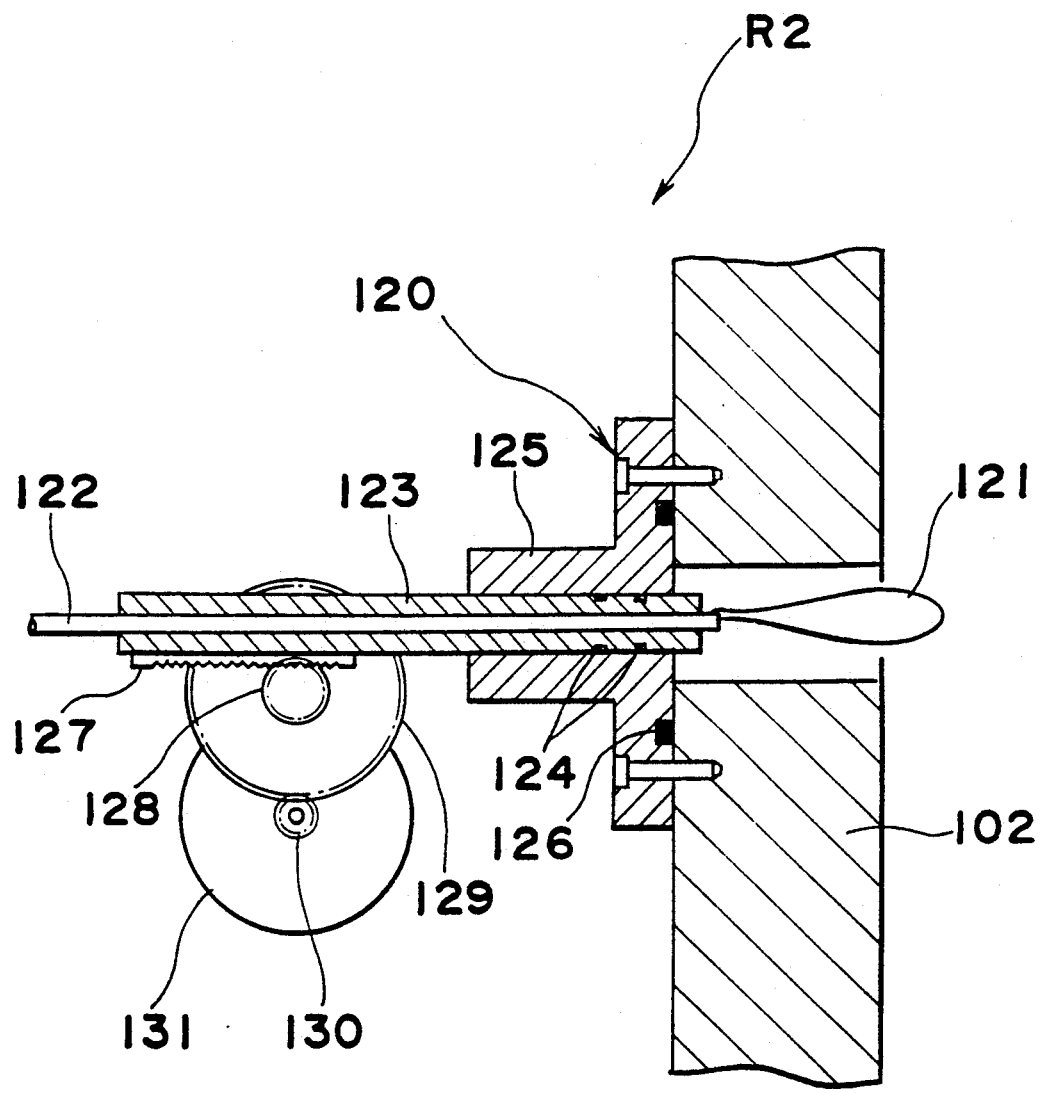
FIG. 5 is a fragmentary cross section showing, on an enlarged scale, an essential portion of the dielectric resonator R2 in FIG. 4.

Referring further to FIGS. 4 and 5, there is shown a dielectric resonator R2 according to one preferred embodiment of the present invention.

In FIG. 4, the dielectric resonator R2 generally includes a cavity C defined by a cylindrical side wall 102, a disc-like bottom plate 101 fixed to said side wall 102 and a similar disc-like lid member 103 applied onto the side wall 103, and a cylindrical support base 104 made of a dielectric material of a low dielectric constant such as forsterite or the like and fixed at a generally central portion on the inner surface of the bottom plate 101, with a dielectric sample 105 in the form of a cylindrical dielectric unit being placed at the upper portion of said support base 104, thereby to dispose the dielectric sample 105 at the central portion of the cavity C. On the side wall 102, at a height equivalent to the central portion thereof, there are provided a signal input connector 110 and a signal output connector (not shown) at two portions. FIG. 4 shows said input connector 110 and a coupling loop 111 connected thereto. Furthermore, in a position on the side wall 102 at a height different from the height equivalent to the central portion of said side wall 102, there is provided a high frequency power injecting portion 120 having a coupling loop 121 connected thereto.

In the upper face of the bottom wall 101, an annular groove g1 is formed adjacent to the peripheral edge of said bottom wall, and with an O-ring 107 placed in said annular groove g1, the bottom plate 101 is fixed to the side wall 102 by a plurality of screws 106. Moreover, a similar annular groove g2 is formed also in the undersurface of the lid member 103 adjacent to the peripheral edge thereof, and another O-ring 108 is accommodated therein. The connector 110, the high frequency power injecting portion 120 and other connectors, etc. (not particularly shown) are also provided with O-rings (for example, an O-ring 112 for the connector 110) in flange portions thereof for mounting.

At the central portion of the bottom plate 101, there is formed on exhaust port 109, which is connected to a vacuum pump through a flange 113, a pipe and a valve, etc. (not particularly shown).

With respect to the shield case constituted by the side wall 102 and the bottom plate 101, etc., the dielectric sample 105 is inserted thereinto through its opening, and after placing the lid member 103 over the opening of the shield case, vacuum evacuation is effected through the exhaust port 109, and thus, the lid 103 is subjected to the vacuum attraction with respect to the shield case, while vacuum state is established within the cavity. Thereafter, by injecting the high frequency wave for heating through the coupling loop 121, the dielectric sample 105 is subjected to high frequency heating, for example, in $TH_{011+\delta}$ mode. Simultaneously, the dielectric resonator is caused to resonate in $TH_{01\delta}$ mode between the connector 110 and the other connector (not shown here) to measure the resonance frequency thereof. By measuring resonance frequencies of the dielectric resonator with respect to the temperatures at different two points, the temperature coefficient of the frequency of the dielectric sample is obtained.

FIG. 5 shows the detailed construction of the high frequency power injecting portion 120 referred to with respect to FIG. 4.

In the high frequency power injecting portion 120 shown in FIG. 5, a semi-rigid coaxial cable 122 has a coupling loop 121 connected between its central conductor and grounding at the forward end portion thereof (It is to be noted here that although the coupling loop 121 normally forms a circular loop in a horizontal plane, its loop face is shown for explanation). Around the forward end portion of the coaxial cable 122 at the side of the cavity C, a rigid sleeve 123 such as a metallic pipe or the like is fitted, and at one portion of the sleeve 123 close to the distal end thereof, two grooves are formed in the circumferential direction so as to receive O-rings 124 therein respectively. On the other hand, on the side wall 102 which is a part of the cavity C, a slide bearing 125 is fixed by screw at its flange portion formed with an annular groove in which an O-ring 126 is accommodated. The sleeve 123 is extended through the slide bearing 125 so as to be guided thereby. The sleeve 123 is provided with a rack 127 which is engaged with a gear 130 fixed on a driving shaft of a stepping motor 131 through reduction gears 128 and 129.

By the arrangement of the high frequency power injecting portion 120 as describe so far, upon rotation of the stepping motor 131, the sleeve 123 is driven in the direction into or out of the cavity C through the reduction gears 128 and 129 and the rack 127. Accordingly, the amount of protrusion of the coupling loop 121 into the cavity C is varied, thereby to alter the area affected by the coupling loop 121. More specifically, in the case where Qo of the resonator is increased by the temperature variation of the dielectric sample, the sleeve 123 is slid leftward in FIG. 5 to increase the external value Q (Qe) of the coupling loop 121, while, upon lowering of the value Qo, the sleeve 123 is slid rightward to reduce the value Qe of the coupling loop 123, whereby the relation Qe=Qo may be maintained at all times. It is to be noted here that, since the portion between the sleeve 123 and the slide bearing 125 is sealed by the two O-rings 124, there is no leakage of air during sliding of the sleeve 123.

By the embodiment of FIGS. 4 and 5, the amount of protrusion of the coupling member with respect to the cavity may be varied, thereby to alter the external value Q for maintaining the matched state with respect to the dielectric resonator.

For example, in the case where the dielectric unit placed inside the cavity C is heated by high frequency waves through injection of the high frequency power from the coupling member, the external value Q of the coupling member may be adapted to follow value Qo which varies as the dielectric unit is heated so as to inject the high frequency power in the matched state at all times for a marked improvement of the heating efficiency. Therefore, when the dielectric resonator R2 is employed, for example, in the temperature characteristics tests of a dielectric unit or material constant measurement of a dielectric material, the dielectric unit may be heated up to a predetermined temperature in a short period of time, thus making it possible to reduce the testing time or measuring time.

Figure 6:
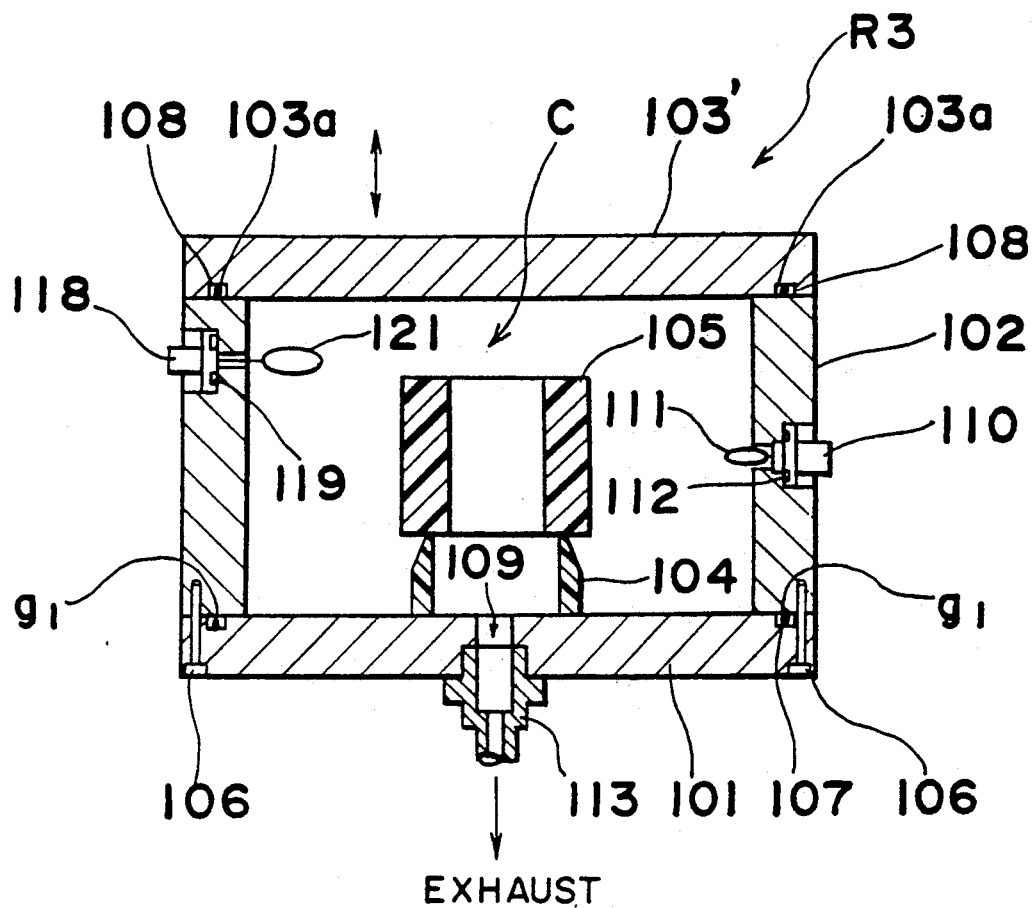
FIG. 6 is a view similar to FIG. 4, which particularly shows a modified dielectric resonator R3 according to the present invention.
Figure 7:
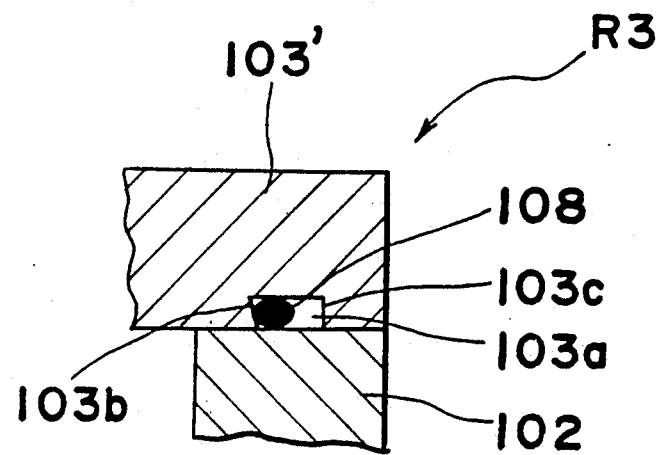
FIG. 7 is a fragmentary cross section showing, on an enlarged scale, an essential portion of the dielectric resonator R3 in FIG. 6.

Referring further to FIGS. 6 and 7, there is shown a dielectric resonator R3 according to another embodiment of the present invention.

As shown in FIG. 6, generally in the similar manner as in the dielectric resonator R2 in FIG. 4, the dielectric resonator R3 includes the cavity C defined by the cylindrical side wall 102, the disc-like bottom plate 101 fixed to said side wall 102 and the similar disc-like lid member 103 applied onto the side wall 103, and the cylindrical support base 104 made of a dielectric material of a low dielectric constant such as forsterite or the like and fixed on the inner surface of the bottom plate 101, with he dielectric sample 105 in the form of the cylindrical dielectric unit being placed at the upper portion of said support base 104, thereby to dispose the dielectric sample 105 at the central portion of the cavity C. On the side wall 102, at a height equivalent to the central portion thereof, there are provided the signal input connector 110 and a signal output connector (not shown) at two portions. FIG. 6 shows aid input connector 110 and the coupling loop 111 connected thereto. Furthermore, in a position on the side wall 102 at a height different from the height equivalent to the central portion of said side wall 102, there is provided a connector 118 having a coupling loop 121 connected thereto.

At the central portion of the bottom plate 101, there is formed the exhaust port 109, which is connected to a vacuum pump through the flange 113, pipe and valve, etc. (not particularly shown).

In the upper face of the bottom wall 101, the annular groove g1 is formed adjacent to the peripheral edge of said bottom wall, and with the O-ring 107 placed in said annular groove, the bottom plate 101, is fixed to the side wall 102 by the screws 106. Moreover, a similar annular groove is formed also in the undersurface of the lid member 103 adjacent to the peripheral edge thereof, and another O-ring 108 is accommodated therein. The connectors 110 and 118, etc., are also provided with O-rings 112 and 119 in the flange portions thereof for mounting.

The dielectric resonator R3 according to this embodiment of FIG. 7 is characterized in the construction of the groove 103a formed in the lid member 103' for accommodating the O-ring 108, etc. as described hereinafter.

FIG. 7 shows the joined portion between the lid member 103, and the side wall 102 (i.e. the portion surrounded by the circle in FIG. 6 in a fragmentary cross section on an enlarged scale, in which it will be seen that the inner peripheral wall 103b of the annular groove 103a formed in the undersurface of the lid member 103' is tapered or inclined with respect to the outer peripheral wall 103c thereof for holding the O-ring 108 therein.

With respect to the shield case constituted by the side wall 102 and the bottom plate 101, etc., the dielectric sample 105 is inserted thereinto through the opening of said shield case, and after placing the lid member 103' over the opening of the shield case, vacuum evacuation is effected through the exhaust port 109, and thus, the lid member 103' is subjected to the vacuum attraction with respect to the shield case, while vacuum state is established within the cavity C.

In the above case, by lowering the vacuum degree within the cavity C below $10^{-2}$ Torr, heat radiation by the dielectric sample through air convection within the cavity C may be remarkably reduced. Meanwhile, since atmospheric pressure of about 1 kgf/cm$^2$ is stably applied to the lid member 103', the joined state of the lid member 103' with respect to the shield case may be stabilized.

After the dielectric resonator is constituted, with the interior of the cavity C having been evacuated, by injecting the high frequency wave for heating through the connector 118, the dielectric sample 105 is subjected to high frequency heating, for example in $TH_{011+\delta}$ mode. Simultaneously, the dielectric resonator R3 is caused to resonate in $TH_{01\delta}$ mode between the connector 110 and the other connector (not shown here) to measure the resonance frequency thereof. By measuring resonance frequencies of the dielectric resonator with respect to the temperatures at different two points, the temperature coefficients of the frequency of the dielectric sample, etc. may be obtained.

Thereafter, for exchanging the dielectric sample 105 with another sample, leakage is permitted through the exhaust port 109 to introduce atmospheric pressure into the cavity, and thereafter, the lid member 103' is removed. In the above case, since the O-ring 108 attached to the lid member 103' is engaged with the taper portion 103b of the annular groove 103a, there is no possibility that the O-ring 108 comes off during attachment or detachment of the lid member 103'. By replacing the dielectric sample 105, and again applying the lid member 103', with subsequent evacuation up to a predetermined pressure for establishment of the vacuum state, the same state of joining of the lid member 103' with respect to the opening of the shield case as in the previous measurement may be reproduced.

It is to be noted that the annular grooves described as provided at the sides of the bottom plate 101 and lid member 103 or 103' in the foregoing embodiment may be modified to be provided at the side of the side wall 102.

According to the above embodiment, since the joined state of the lid member with respect to the opening of the shield case is stabilized, with a good reproducibility, if the arrangement is applied to the dielectric material constant measuring dielectric resonator, the measuring accuracy can be improved, while when it is applied to the general dielectric resonators, the electrical characteristics thereof may be stabilized, with a less scattering.

Moreover, in the case where the dielectric unit (dielectric sample) is subjected to high frequency heating, since the heat of the heated dielectric unit is insulated, heating efficiency may be improved, with a better temperature stability.

Figure 8:
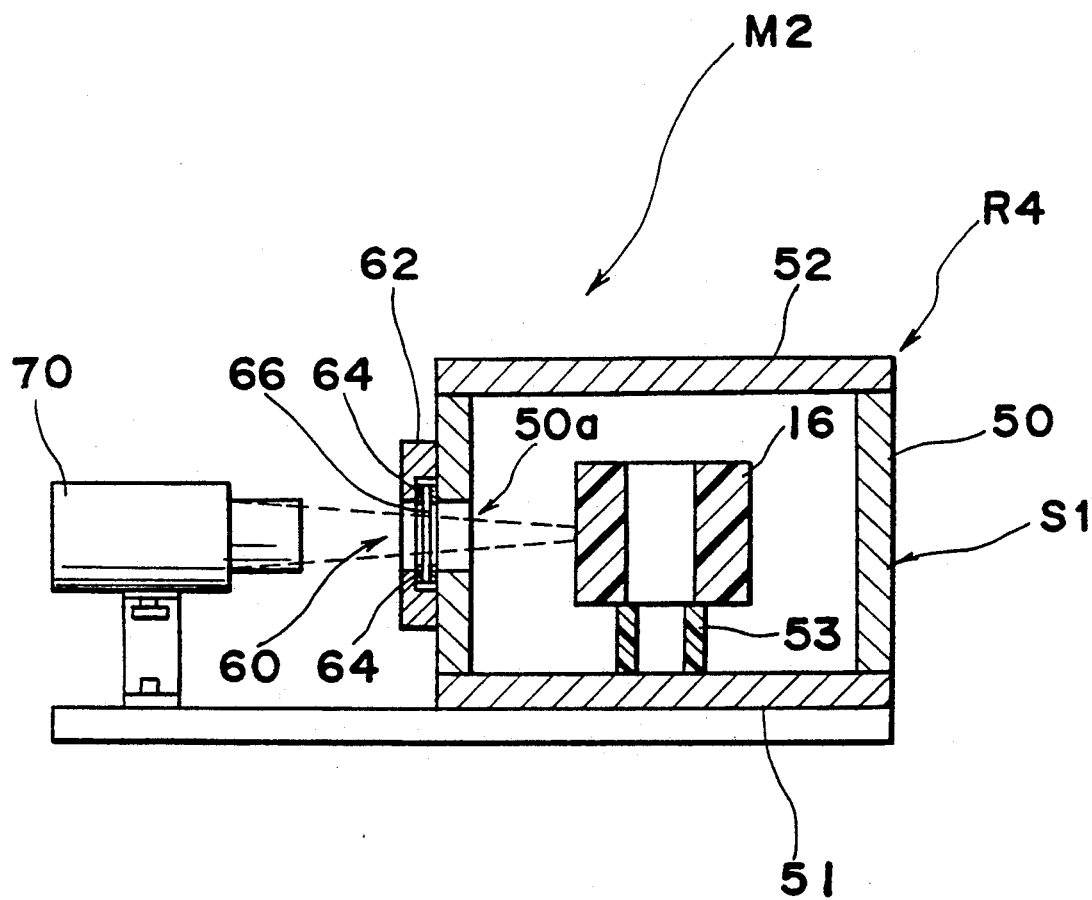
FIG. 8 is a schematic side elevational view, partly in section, showing a dielectric material constant measuring device M2 according to a second embodiment of the present invention.
Figure 9:
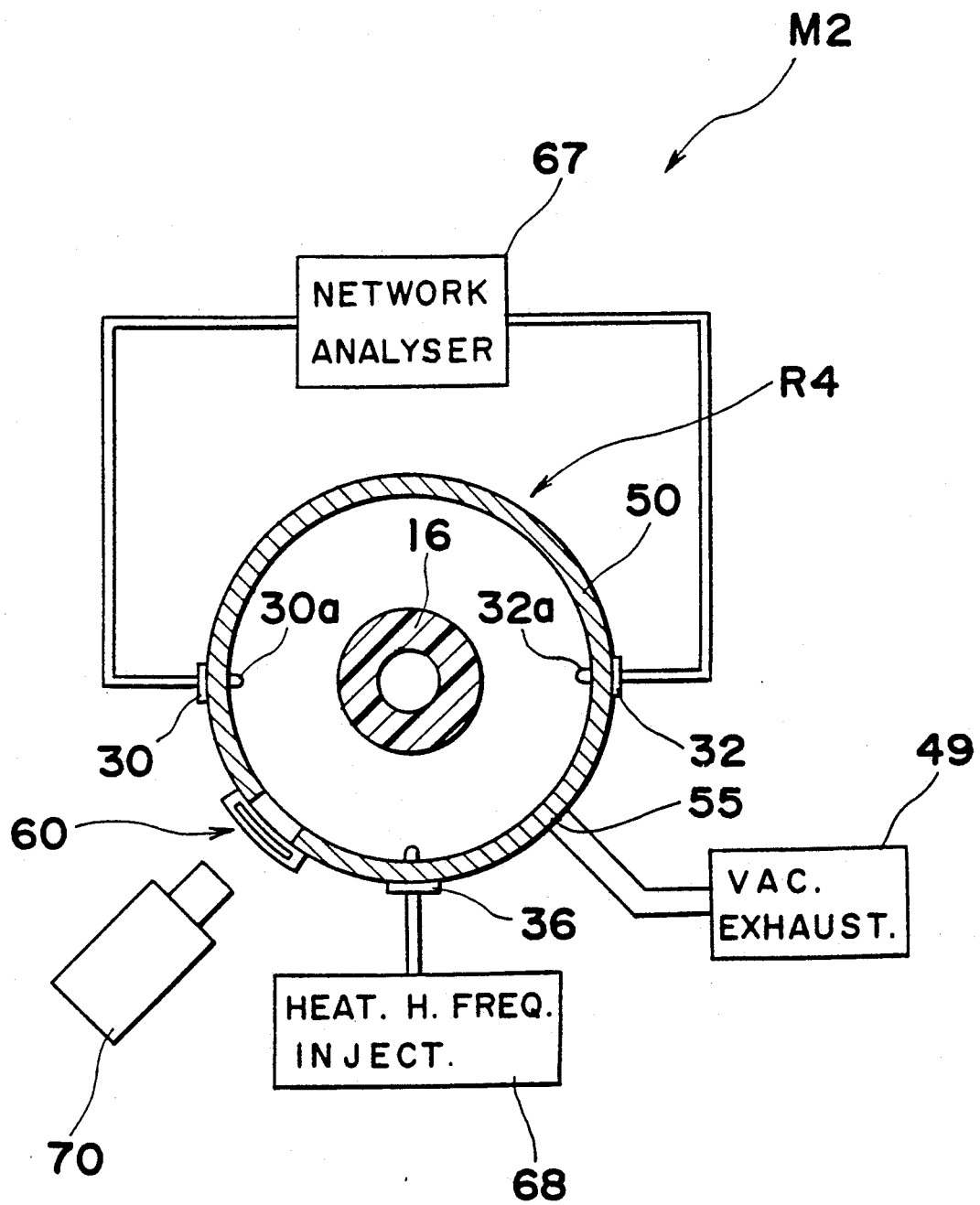
FIG. 9 is a schematic block diagram showing general construction of the measuring device M2 in FIG. 8.

Furthermore, for attaching the lid member onto the shield case, since no screws and the like are required, opening or closing may be effected in a short period of time, with a consequent improvement of the working efficient or productivity. Reference is further made to FIGS. 8 and 9 showing a dielectric material constant measuring device M2 according to a second embodiment of the present invention, which includes the dielectric resonator R4 having the shield case S1 which is made of an electrically conductive material such as aluminum, its alloy, or the like and constituted by the cylindrical side wall 50, bottom wall 51 attached to or integrally formed with the side wall 50, and the lid member 52 applied onto the upper portion of said side wall in the similar manner as in the resonator R1 in FIG. 1. It is to be noted here that the shield case S1 may be modified to be constituted by a dielectric material such as a ceramic material formed with a shield electrode.

As shown in FIG. 8, within the shield case S1 for the dielectric resonator R4, hollow cylindrical dielectric sample 16 is mounted on the cylindrical support base 53 made of a dielectric material having a low dielectric constant such as forsterite or the like, and thus fixedly disposed generally at the central portion in said shield case S1. At one portion of the side wall 50 for the shield case, there is provided an infrared ray transmission window 60, which includes an opening 50a formed in one portion of the side wall 50, a window frame 62 mounted on the outer wall of the side wall 50 around the opening 50a, and a window material 66 for transmitting the infrared rays, with the window material 66 being held between the window frame 62 and the outer wall 50 of the shield case through a sealing material 64 for tightly sealing the opening 50a. The window frame 62 is fixed on said outer wall 50 by screws (not shown) and the like. For the window material 66, for example, monocrystalline BaF2 (barium fluoride) is employed, thereby to transmit infrared rays having wavelengths in the range of 0.2 to 14 μm in the measured wavelengths by a radiation thermometer 70 to be described below.

As stated above, the infrared ray transmission window 60 is provided in the side wall 50 of the shield case, and the infrared ray radiation thermometer 70 is disposed in the vicinity of the dielectric resonator R4 for receiving the infrared rays radiated through the infrared ray transmission window 60. The thermometer 70 is arranged to measure the temperature of the dielectric sample 16 based on spectral distribution, etc. of light radiated from the dielectric sample 16 disposed within the shield case.

As shown in FIG. 9, on the side wall 50 of the shield case, there are provided the connectors 30, 32 and 36, which are respectively provided with coupling loops 30a, 32a and 36a between the central conductors and grounding thereof. Between the connectors 30 and 32, a network analyser 67 is connected, while a high frequency injection device 68 for heating is connected to the connector 36. Moreover, the vacuum exhaust port 55 is formed at the specific position of the shield case for connection of the vacuum exhaust device 49. The vacuum exhaust device 49 is intended to evacuate the interior of the shield case S1 for preventing discharge of heat towards outside by convection of air and heat conduction, and also, to cause the lid member 52 to be attracted by vacuum onto the shield case main portion constituted by the side wall 50 and the bottom wall 51.

Through employment of the measuring device M2 constructed as above, the dielectric material may be measured as stated hereinbelow.

As was also explained with reference to FIG. 1, the temperature coefficient $\tau_f$ of the frequency for the dielectric sample is given by the following equation.

$$\tau_f = (1/f1)(f2 - f1)/(T2 - T1)$$

where T1 represents the temperature before heating, T2 denotes the temperature after heating, f1 shows resonance frequency at the temperature T1, and f2 indicates the resonance frequency at the temperature T2. In other words, by measuring the resonance frequencies of the dielectric resonator with respect to the temperatures at two points, the temperature coefficient of the frequency for the dielectric sample can be obtained. More specifically, the control unit 45 (FIG. 1) measures the temperature T1 of the dielectric sample 16 before the heating by the radiation thermometer 70, and also, reads the resonance frequency f1 at that time by the network analyser 67, and thereafter, actuates the high frequency injection device 68 so as to subject the dielectric sample 16 to the high frequency heating. Based on the measured value of the thermometer 70, the measured value f2 of dielectric resonator R4 is obtained when the temperature of the dielectric sample 16 has reached the predetermined temperature T2.

It is to be noted here that, in the strict sense, since the resonance frequency of the dielectric resonator is varied as the temperature of the dielectric sample 16 rises, even during heating of the dielectric sample 16, the frequency of the high frequency injection device 68 is adapted to be in agreement with the resonance frequency in the heating system resonance mode.

It is to be also noted that, in the above embodiment, although the interior of the shield case is evacuated for vacuum state to reduce heat dissipation by the air convection and conduction within the shield case, in the case where the device is to be used under the atmospheric pressure without particularly evacuating the interior of the shield case, it may be so arranged to form a simple opening at part of the shield case so as to utilize the opening for measuring temperatures.

As described so far, by the above embodiment of the present invention, since the window for transmitting or passing the infrared rays is formed in the shield case, it becomes possible to measure the temperatures of the dielectric sample through said window by the infrared ray radiation thermometer. Therefore, it is not required to provide any particular member for the temperature measurement within the shield means such as the coupling loops, etc., and thus, the temperature of the dielectric sample may be measured at high accuracy in the resonance state in the proper mode, without disturbing the electromagnetic field distribution of the dielectric resonator. As a result, it becomes possible to measure, for example, the frequency temperature coefficient of the dielectric sample at high accuracy.

Figure 10:
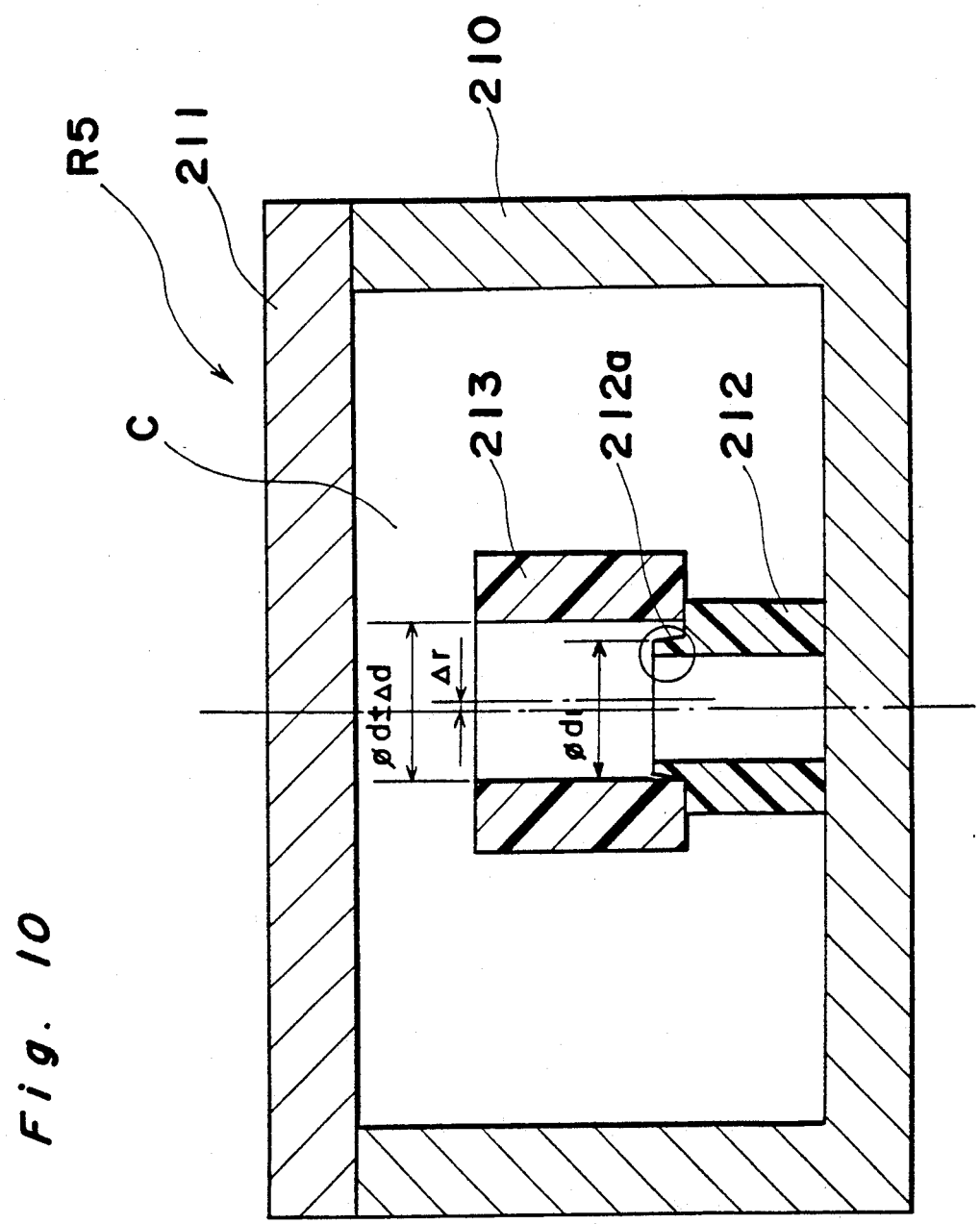
FIG. 10 is a vertical sectional view of a dielectric resonator R5 for the dielectric material constant measurement according to a further embodiment of the present invention.

Reference is also made to FIG. 10 showing a dielectric resonator R6 according to a further embodiment of the present invention.

In FIG. 10, the dielectric resonator R5 generally includes a cavity C defined by a cylindrical shield case 210 having a bottom plate and a lid member 211 applied onto the side wall of said shield case 210, and a cylindrical support base 212 made of a dielectric material of a low dielectric constant such as forsterite or the like and preliminarily fixed at the central portion on the inner surface of the bottom wall of the shield case 210. On the upper surface of the support base 212, an annular protrusion 212a is formed to extend over its entire periphery as shown. A cylindrical dielectric sample 213 to be tested for the dielectric material constant is placed on the above upper surface of the support base 212. In this state, a corresponding opening formed in the bottom face of said dielectric sample 213 is engaged with said protrusion 212a provided on the support base 212.

As shown in FIG. 10, by providing a taper or inclination on the outer peripheral face of the protrusion 212a provided on the upper face of the support base 212, it becomes possible to easily engage the bottom opening of the dielectric sample 213 with the projection 212a of the support base 212 by merely placing the dielectric sample 213 with respect to the support base 212 through a comparatively rough eye measurement or the like.

Here, if the inner diameter of the bottom opening of the dielectric member 213 is $\phi d \pm \Delta d$, the maximum diameter of the protrusion 212a on the upper surface of the support are 212 may be set at $\phi d1 = \phi d - \Delta d$. In this case, the maximum deviation $\Delta r max$ of the center axis of the dielectric sample 213 becomes $\Delta d$. Accordingly, the positioning accuracy of the dielectric sample 213 becomes less than ½ of scattering width of the inner diameter of said dielectric sample.

In the embodiment of FIG. 10, although the support base 212 is formed into a generally cylindrical shape, with the annular protrusion being formed to continuously extend upwardly therefrom, such a support base itself may be modified, for example, into such a shape as will support, at least, three points of the bottom face of the dielectric unit so as to horizontally support said dielectric unit at a predetermined height, and also, the protrusion of the support base may be altered into a shape as will effect positioning of the peripheral edge of the bottom opening of the dielectric unit at several places. By way of example, three projections may be formed through a central angle of 120° from each other, with a taper being provided at the outer face of each projection.

By the above embodiment according to the present invention, for positioning the dielectric unit in the cavity or on a circuit board, it can be easily positioned through mere placing of the dielectric unit on the upper portion of the support base without employment of a scale or the like, and thus, the positioning work may be effected in an extremely short period of time. Moreover, since it is not necessary to provide a specific positioning mechanism or the like within the resonator, not to employ any positioning device during assembly, a dielectric resonator simple in construction may be readily constructed.

Figure 11:
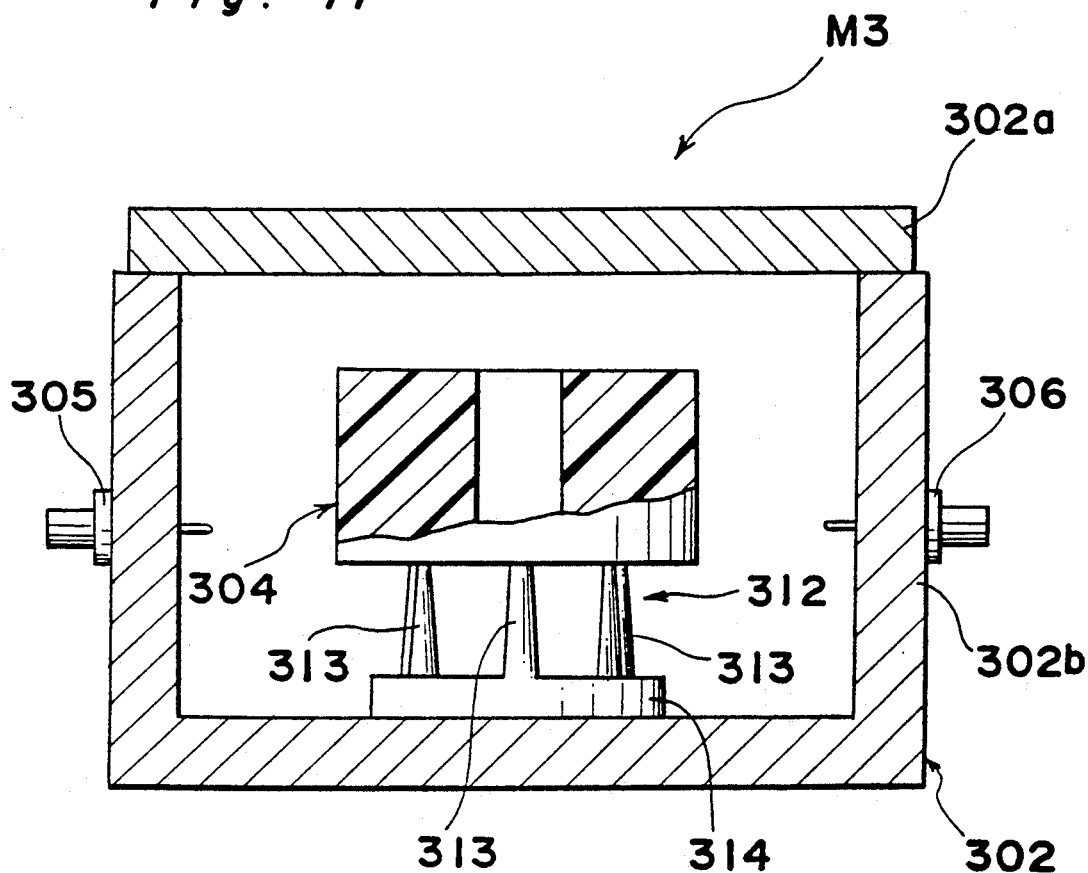
FIG. 11 is a vertical sectional view of a temperature characteristics measuring device M3 according to a third embodiment of the present invention.

Referring further to FIG. 11, there is shown a temperature characteristics measuring device M3 according to a third embodiment of the present invention.

In FIG. 11, the temperature characteristics measuring device M3 includes a conductor cavity case 302 having a lid member 302a for closing an opening at the upper portion of the cavity case 302, input and output connectors 305 and 306 mounted on the side wall 302b of said conductor cavity case and having coupling means such as coupling loops (not particularly shown) for coupling with a dielectric sample, and a support member 312 provided within said conductor cavity case 302 to support thereon the dielectric sample 304 to be measure for the temperature characteristics, thereby to measure the temperature characteristics of the dielectric sample 304 by raising its temperature through injection of a high frequency wave into said dielectric sample from the high frequency injecting device for heating.

In the above measuring device M3, the support member 312 for the dielectric sample 304 has a plurality of, for example, three support rods 313 extending upwardly therefrom, so as to support said dielectric sample 304 at forward ends of the respective support rods 313.

Figure 12:
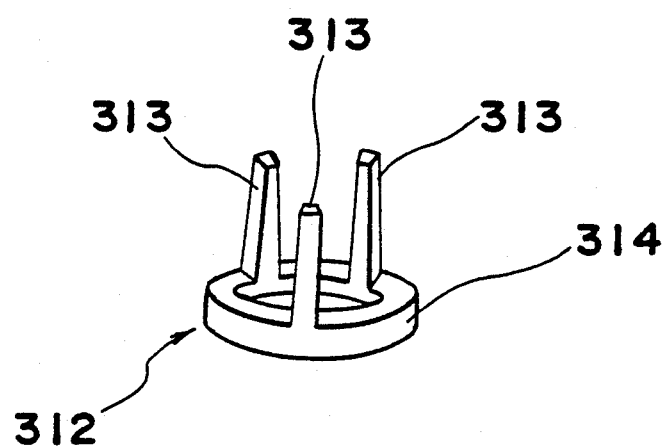
FIG. 12 is a perspective view of a dielectric sample support member employed in the measuring device M3 in FIG. 11.

As shown in FIG. 12, the respective support rods 313 extend upwardly from an annular base portion 314 of the support member 312 through an angular interval of 120°, and are arranged to be reduced in cross sections thereof as the distance from said annular base portion 314 is increased.

In the above arrangement, when the dielectric sample 304 is heated as the high frequency wave is injected from the high frequency injection device (not shown here) through the connector 305, the heat is conducted, through the support member 312, to the conductor cavity case 302. In this case, however, since the support rods 313 of the support member 312 for the dielectric sample 304 are small in the volume and consequently in the heat capacity, heat conduction is not readily effected through these support rods 313, and thus, heat conduction from the dielectric sample 304 to the conductor cavity case 302 may be suppressed, whereby the dielectric sample 304 to be measured for the temperature characteristics may be rapidly raised in its temperature.

Figure 13:
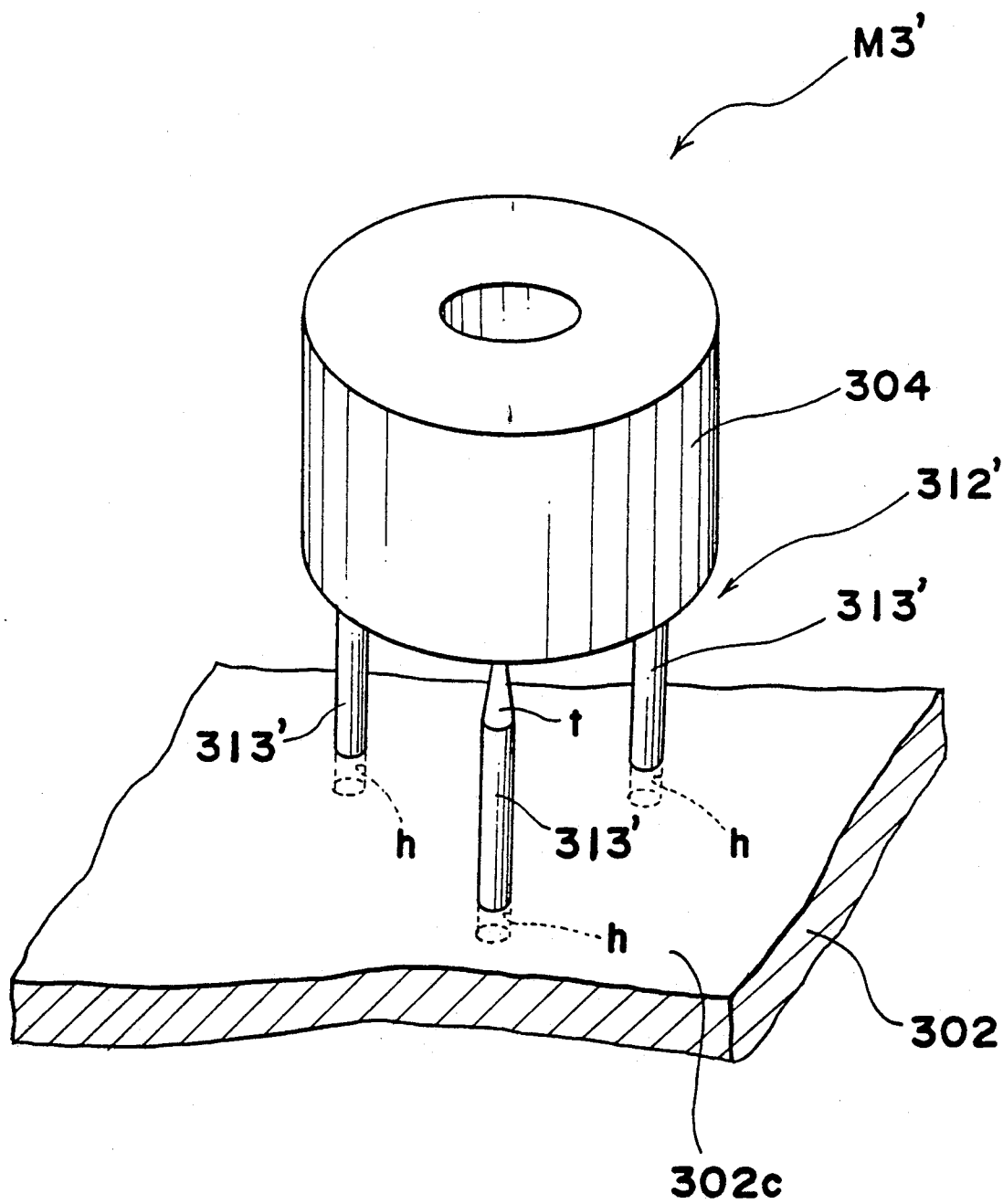
FIG. 13 is a fragmentary perspective view of a modified temperature characteristics measuring device M3', particularly showing a dielectric sample support portion thereof.
Figure 14:
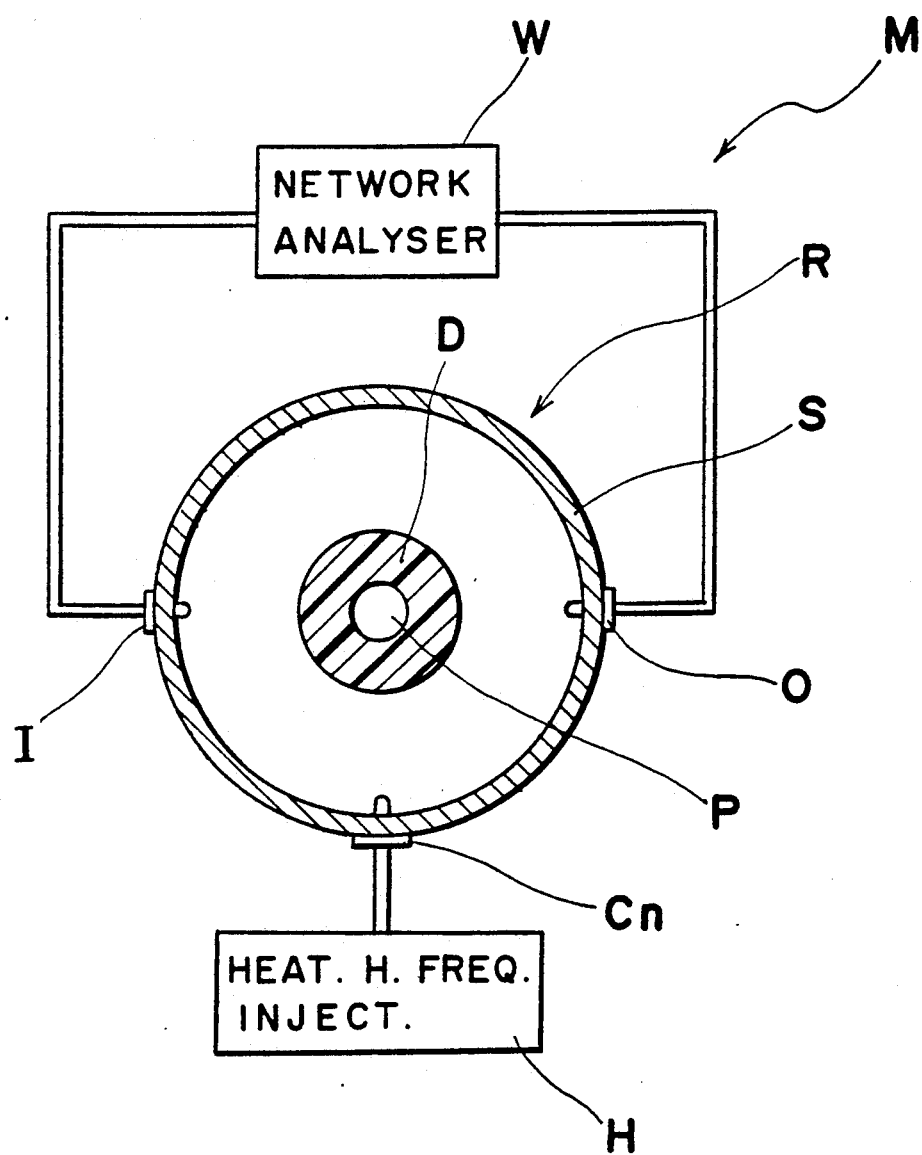
FIG. 14 is a schematic block diagram showing the general construction of a conventional dielectric material constant measuring device (already referred to).

As described above, in the temperature characteristics measuring device for the dielectric material in FIG. 11, since the escape of heat from the dielectric sample may be suppressed, the temperature approximately only of the dielectric sample 304 is rapidly raised, thus making it possible to efficiently measure the temperature characteristics of the dielectric resonator 304. In FIG. 13, there is shown an essential portion of a modified temperature characteristics measuring device M3', in which a modified support member 312' includes, for example, three support rods 313' each of which is fitted, at its lower end, in a corresponding hole h formed in the bottom wall 302c of the conductor cavity case 302 so as to extend upwardly therefrom for supporting the dielectric sample 304 at the forward ends t of said support rods 313'.

The forward end t of each support rod 313' may be formed with a taper so as to be pointed as shown in FIG. 13.

By the above arrangement also, it is possible to heat the dielectric sample 304 only so as to rapidly raise its temperature.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A measuring device for dielectric material constants, which comprises:
   a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

further comprising support means provided within said shield case to support thereon said dielectric sample whose temperature characteristics are to be measured when its temperature is raised by injecting a high frequency wave into said dielectric sample from a high frequency injecting device for heating, said support means being provided with a plurality of support rods extending upwardly therefrom, so as to support said dielectric sample at forward ends of the respective support rods.

2. A measuring device as claimed in claim 1, wherein said support means is of a low dielectric constant material and includes an annular base portion on which said support rods are provided to extend upwardly therefrom.

3. A measuring device for dielectric material constants, which comprises:

a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

wherein said frequency measuring means measures the resonance frequency of said dielectric resonator, and said high frequency power injecting means heats said dielectric sample in a mode in which electromagnetic field strength becomes approximately the lowest at positions of said signal input coupling means and signal output coupling means, by injecting high frequency power into the particular coupling means, whereby the specific material constant of the dielectric sample is obtained from resonance frequencies at different temperatures of said dielectric sample.

4. A measuring device for dielectric material constants, which comprises:

a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

wherein said case has wall means to define a cavity therein, a dielectric unit provided in the cavity, a coupling member extending into said cavity through said wall means, said dielectric resonator further comprising coupling member guiding means for movably guiding said coupling member in internal and external directions with respect to said cavity, and an actuator for displacing said coupling member along said guiding means, whereby an external Q value is adjustable by the degree of projection of said coupling member into said cavity.

5. A measuring device for dielectric material constants, which comprises:

a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

further comprising a lid member for tightly closing an opening of said shield case, said shield case and said lid member defining a cavity therein, which is evacuated to provide a vacuum state so as to subject the lid member to vacuum attraction with respect to said shield case.

6. A measuring device for dielectric material constants, which comprises:

a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

wherein said shield case is formed, in one part thereof, with a window portion for transmitting or passing infrared rays radiated from said dielectric sample therethrough.

7. A measuring device as claimed in claim 1, wherein said support means is of a low dielectric constant material and includes said support rods respectively fitted into holes formed in an inner bottom wall of said shield case for fixing thereat so as to extend upwardly therefrom, each of said support rods being provided with a taper so as to be pointed at its forward end.

8. A measuring device for dielectric material constants, which comprises:

a dielectric resonator including a shield case provided with a plurality of coupling means for signal input and output, with a dielectric sample disposed within said shield case, a positive feed-back circuit including an amplification circuit, and connected between a signal input coupling means and a signal output coupling means so as to constitute an oscillation circuit together with said dielectric resonator, frequency measuring means for measuring an oscillation frequency of said oscillation circuit, and high frequency power injecting means for heating said dielectric sample by injecting high frequency power into the particular coupling means, whereby a specific material constant of the dielectric sample is determined from the oscillation frequencies before and after heating of said dielectric sample;

wherein said dielectric resonator further comprises a resonator cavity defined by the shield case and a lid member for the shield case, a support base fixed at a predetermined position in said shield case, and a cylindrical dielectric unit disposed on said support base, said support base being formed, at its upper face, with a protrusion which is fitted into an opening in a bottom face of said cylindrical dielectric unit.

* * * * *